United States Patent
Onaka (10) Patent No.: US 7,187,168 B2
(45) Date of Patent: Mar. 6, 2007

(54) DIRECTION SENSOR INCLUDING FIRST AND SECOND DETECTING CIRCUITS AND FIRST AND SECOND MAGNETIC BIAS APPLICATION PARTS

(75) Inventor: Kazuhiro Onaka, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 247 days.

(21) Appl. No.: 10/500,012

(22) PCT Filed: Dec. 24, 2002

(86) PCT No.: PCT/JP02/13436

§ 371 (c)(1),
(2), (4) Date: Jun. 23, 2004

(87) PCT Pub. No.: WO03/056276

PCT Pub. Date: Oct. 7, 2003

(65) Prior Publication Data

US 2004/0248327 A1 Dec. 9, 2004

(30) Foreign Application Priority Data

Dec. 27, 2001 (JP) .............................. 2001-396389

(51) Int. Cl.
 *G01R 33/02* (2006.01)
(52) U.S. Cl. ..................................................... 324/252

(58) Field of Classification Search ................. 324/252
See application file for complete search history.

(56) References Cited

U.S. PATENT DOCUMENTS

| | | | | |
|---|---|---|---|---|
| 4,361,805 A | * | 11/1982 | Narimatsu et al. | 324/207.21 |
| 5,585,719 A | * | 12/1996 | Endo et al. | 324/235 |
| 5,982,178 A | * | 11/1999 | Pant et al. | 324/252 |
| 6,329,818 B1 | * | 12/2001 | Tokunaga et al. | 324/252 |
| 6,501,678 B1 | * | 12/2002 | Lenssen et al. | 365/173 |
| 2004/0130323 A1 | * | 7/2004 | Oohashi et al. | 324/252 |

FOREIGN PATENT DOCUMENTS

| | | |
|---|---|---|
| JP | 64-31071 | 2/1989 |
| JP | 02-186285 | 7/1990 |
| JP | 2001-345498 | 12/2001 |
| WO | 98/57188 | 12/1998 |

* cited by examiner

*Primary Examiner*—Jay M. Patidar
(74) *Attorney, Agent, or Firm*—Wenderoth, Lind & Ponack, L.L.P.

(57) ABSTRACT

A direction sensor has first and second bridge circuits, each of the bridge circuits including at least two detecting elements formed on a main surface of a substrate and connected in series, their longitudinal directions crossing each other. The sensor also has first and second magnetic bias application parts respectively facing toward the first and the second bridge circuits. The directions of the magnetic fields of the magnetic bias application parts are different from each other. The direction sensor does not require a holder or a coil, so that miniaturization of the sensor is feasible.

5 Claims, 6 Drawing Sheets

DIRECTION SENSOR INCLUDING FIRST AND SECOND DETECTING CIRCUITS AND FIRST AND SECOND MAGNETIC BIAS APPLICATION PARTS

TECHNICAL FIELD

This invention relates to a direction sensor to be used for various electronic instruments and a production method thereof.

BACKGROUND ART

Figure 10A:
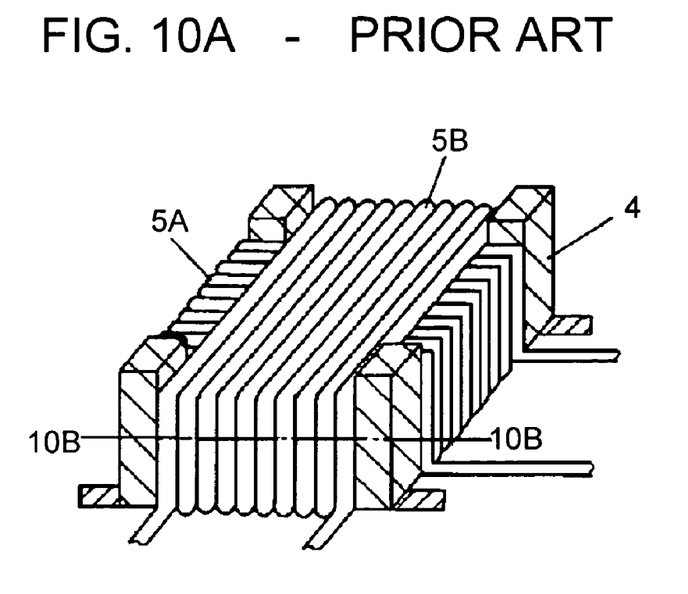
FIG. 10A is a perspective view of an ordinary direction sensor.
Figure 10B:
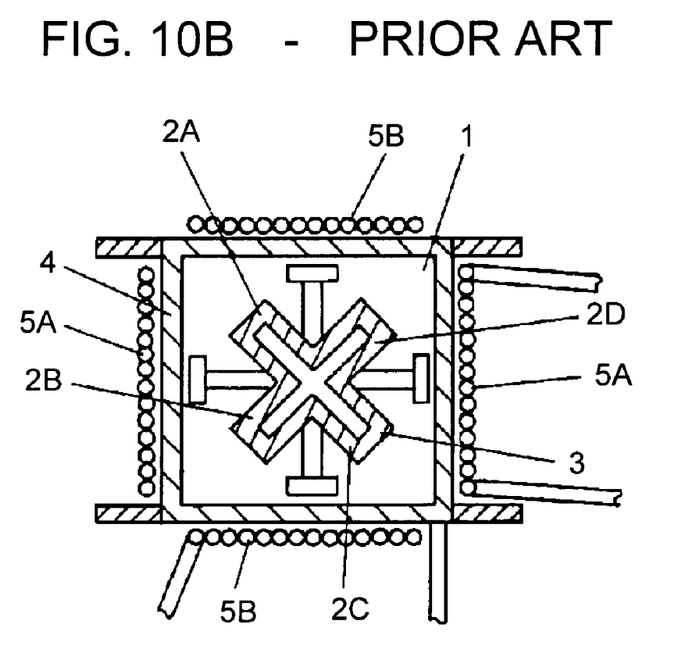
FIG. 10B is a sectional view of the ordinary direction sensor taken along the line 10B—10B of FIG. 10A.

FIG. 10A is a perspective view of an ordinary direction sensor, and FIG. 10B is a sectional view of the same taken along the line 10B—10B. The ordinary direction sensor has:

bridge circuit 3 including four detecting elements 2A to 2D, placed on an upper surface of substrate 1;

holder 4 holding substrate 1 and covering substrate 1 including bridge circuit 3; and first coil 5A and second coil 5B forming magnetic bias application parts, made of conductive wires, winding up around holder 4 with predetermined winding numbers, and being at right angles to each other.

In the ordinary direction sensor, substrate 1 including detecting elements 2A to 2D is held by holder 4, and first coil 5A and second coil 5B wind around holder 4. Because of this structure, the ordinary direction sensor is large and it is difficult to miniaturize.

SUMMARY OF THE INVENTION

A direction sensor in the present invention has a first detecting circuit including at least two detecting elements mounted on a main surface of a substrate, a second detecting circuit constituted identically with the first circuit, a first magnetic bias application part disposed in a position facing the first detecting circuit, and a second magnetic bias application part disposed in a position facing the second detecting circuit. The second magnetic bias application part generates a magnetic field in a direction different from a magnetic field generated by the first magnetic bias application part.

DETAILED DESCRIPTION OF PREFERRED EMBODIMENTS

Exemplary embodiments of the present invention will be demonstrated hereinafter using the drawings. A same reference mark is used for an identical constituent, and detailed explanation of it is omitted.

First Exemplary Embodiment

Figure 1A:
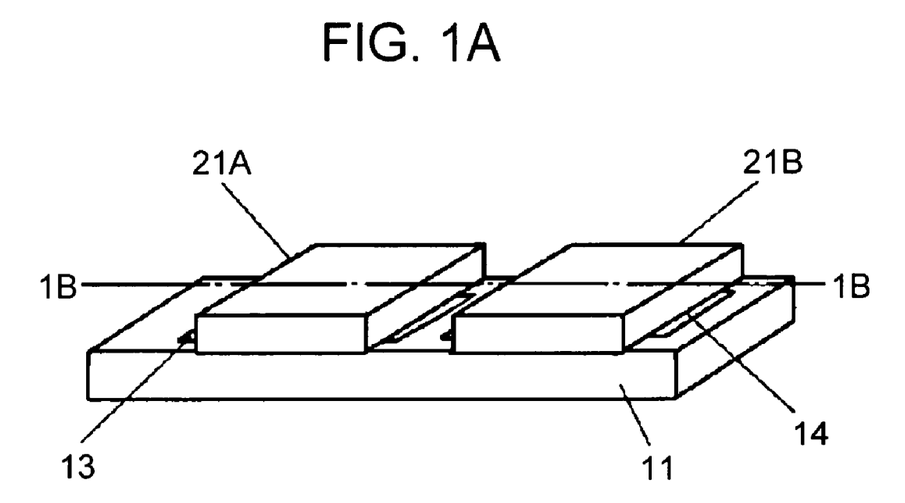
FIG. 1A is a perspective view of a direction sensor in accordance with a first exemplary embodiment of the present invention.
Figure 1B:
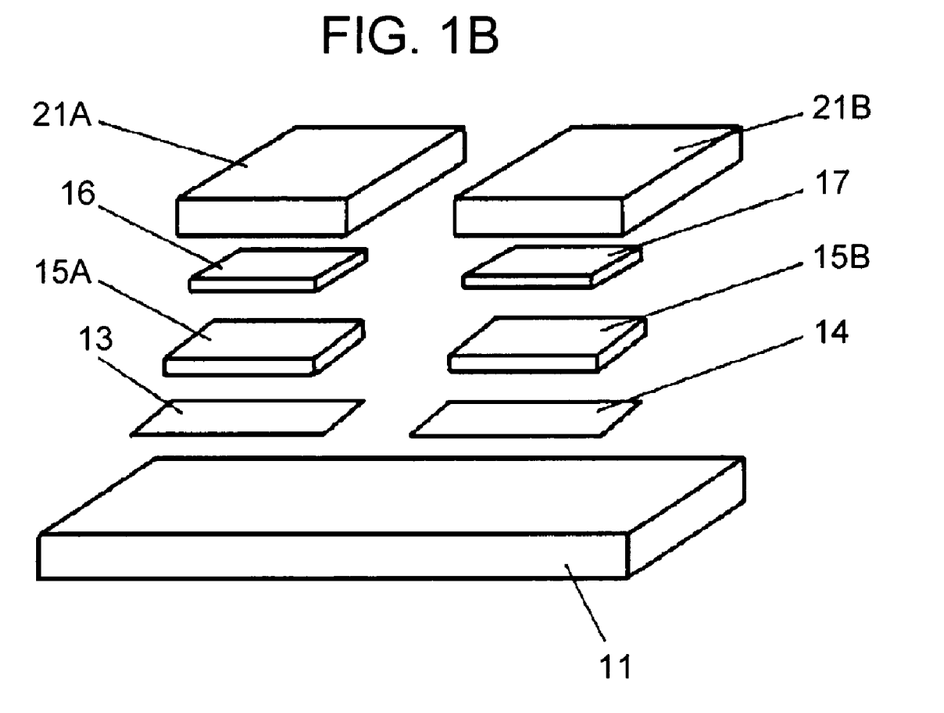
FIG. 1B is an exploded perspective view of the direction sensor in accordance with the first exemplary embodiment of the present invention.
Figure 2:
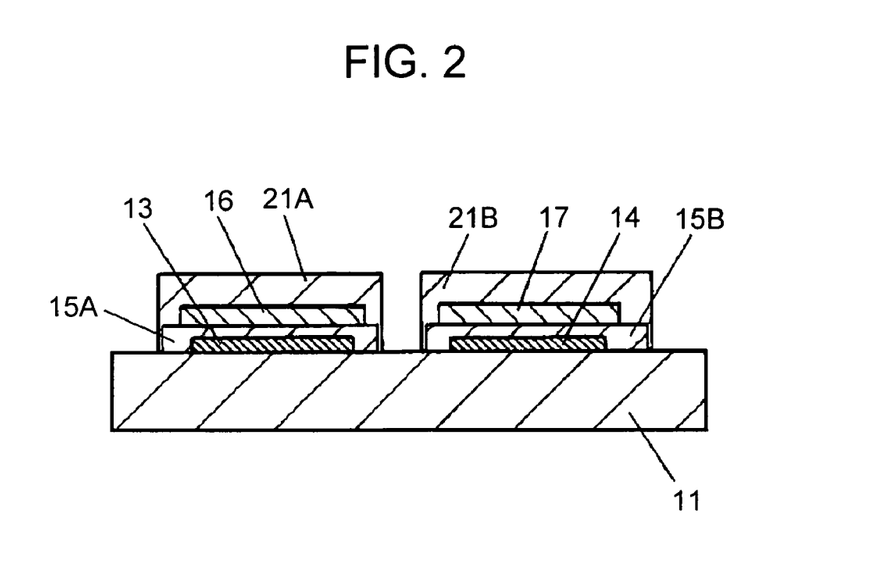
FIG. 2 is a sectional view of the direction sensor in accordance with the first exemplary embodiment of the present invention, taken along the line 1B—1B of FIG. 1A.
Figure 3:
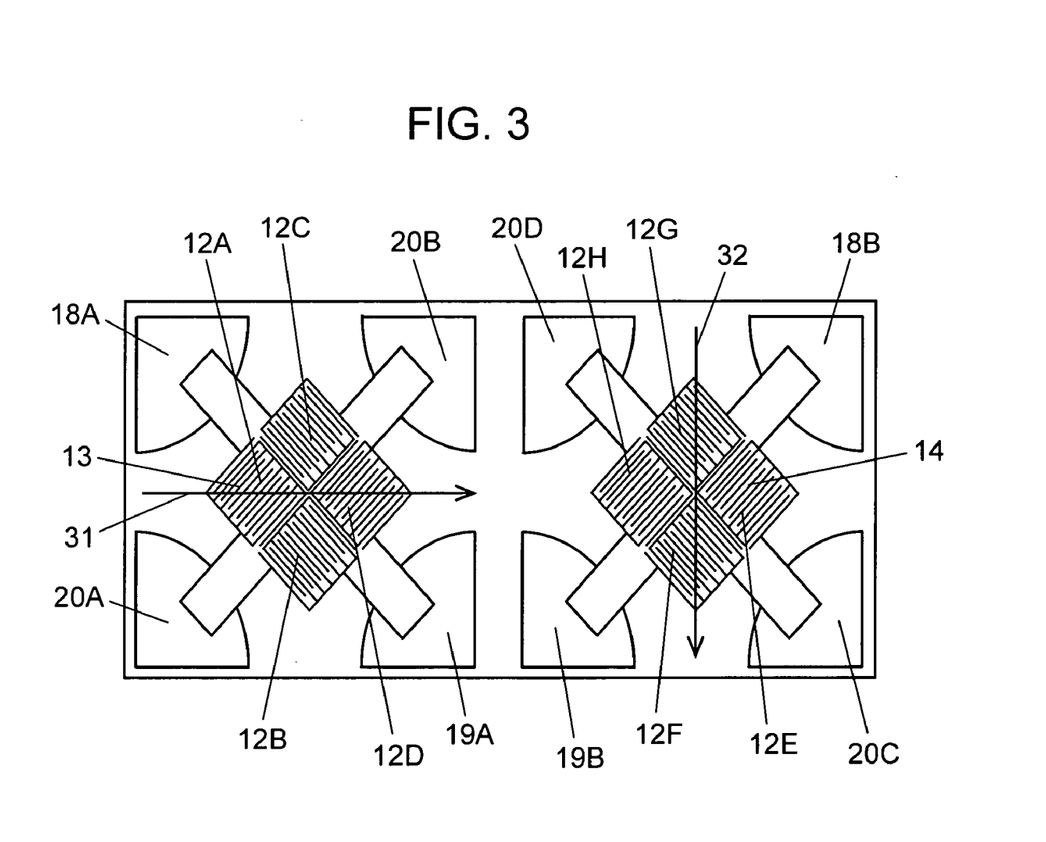
FIG. 3 is a plan view of an upper surface of first and second bridge circuits, main parts of the direction sensor in accordance with the first exemplary embodiment of the present invention.
Figure 4:
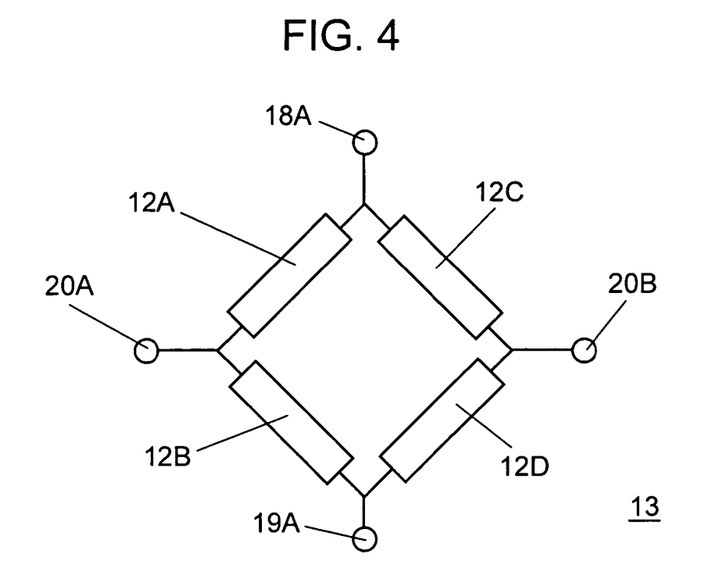
FIG. 4 is an electric circuit diagram of the first bridge circuit, the main part of the direction sensor in accordance with the first exemplary embodiment of the present invention.

FIG. 1A is a perspective view of a direction sensor in accordance with a first exemplary embodiment of the present invention 1. FIG. 1B is an exploded perspective view of the same. FIG. 2 is a sectional view of the same, taken along the line 1B—1B, and FIG. 3 is a plan view of first and second bridge circuits, main parts of the same. FIG. 4 is an electric circuit diagram of the first bridge circuit of the direction sensor in accordance with the first exemplary embodiment.

As shown in FIG. 1A to FIG. 3, the direction sensor in the first exemplary embodiment has:

substrate 11, first bridge circuit 13 (a first detecting circuit) having first detecting element 12A to fourth detecting element 12D, formed on an upper surface of substrate 11, second bridge circuit 14 (a second detecting circuit) having fifth detecting element 12E to eighth detecting element 12H, insulating layers 15A and 15B respectively deposited on upper surfaces of first bridge circuit 13 and second bridge circuit 14, first magnetic bias application part 16 and second magnetic bias application part 17 (hereafter, each called application part) respectively disposed on upper surfaces of insulating layers 15A and 15B, facing toward first bridge circuit 13 and second bridge circuit 14, respectively, cover layers 21A and 21B composed of, such as, epoxy resin and silicon resin respectively deposited on upper surfaces of first application part 16 and second application part 17.

First and second application parts 16 and 17 are constituted so that their generated magnetic fields are directed substantially 90° different from each other, as shown by arrow marks 31 and 32 in FIG. 3.

The constituent members are explained hereinafter.

Substrate 11 is in a rectangular shape and made of an insulating material such as alumina. A glass glaze layer is preferably formed on a main surface of the substrate because it is easy to get a smooth surface of the layer, and therefore, it makes it easy to form first bridge circuit 13 and second bridge circuit 14 thereon.

First bridge circuit 13 is composed of first detecting element 12A, second detecting element 12B, third detecting element 12C and fourth detecting element 12D. First detecting element 12A to fourth detecting element 12D are made of, such as, a strong-ferromagnetic thin film or an artificial lattice multilayer field folded multiple of times. The ferromagnetic thin film is composed of NiCo, NiFe, or the like, which changing rate of resistance value reaches a peak when an outside magnetic field is vertically applied. By folding the film multiple times, the number of lines of the terrestrial magnetism crossing the film is increased, so that the changing rate of the resistance value becomes high, improving a terrestrial magnetism detecting sensitivity.

First detecting element 12A and second detecting element 12B are electrically connected in series, and third detecting element 12C and fourth detecting element 12D are also connected in series. The series circuit of first detecting element 12A and second detecting element 12B and the series circuit of third detecting element 12C and fourth detecting element 12D are electrically connected in parallel. The joint part of first detecting element 12A and second detecting element 12B is connected to first output electrode 20A, and the joint part of third detecting element 12C and fourth detecting element 12D is connected to second output electrode 20B.

Longitudinal directions in the patterns of first detecting element 12A and second detecting element 12B are different by substantially 90°. Regarding third detecting element 12C and fourth detecting element 12D, the arrangement is similar to that of elements 12A and 12B. The longitude directions in the patterns of first detecting element 12A and fourth detecting element 12D are in parallel. Regarding second detecting element 12B and third detecting element 12C, the arrangement is similar to that of elements 12A and 12D.

Further, first detecting element 12A and third detecting element 12C are connected to input electrode 18A, and second detecting element 12B and fourth detecting element 12D are connected to ground electrode 19A.

Thus, first detecting element 12A to fourth detecting element 12D constitute a full bridge as shown in FIG. 4. A variation of a differential voltage between two output voltages at first output electrode 20A and second output electrode 20B is increased with an effect of the bridge circuit, so that compass direction is precisely identified. Further, because noise from the two output voltages cancel each other, a dispersion of identifying direction due to the noise remains small.

Moreover, the longitudinal directions of detecting element 12A to fourth detecting element 12D are all angled 45° to a direction of the magnetic field produced by first application part 16. By constituting like this, the resistance values of first detecting element 12A to fourth detecting element 12D are considered to change linearly with the change of the magnetic field. Therewith, compass direction is easily calculated by the differential voltage. In this exemplary embodiment, the longitudinal directions of first detecting element 12A to fourth detecting element 12D are each angled by 45° to the magnetic field generated by first application part 16. If the angle is set at 0° or 180°, the magnetic field generated by first application part 16 does not affectively change the resistance value of the detecting elements, namely it does not act as a bias magnetic field. Because of the reason, 0° and 180° are desirably avoided, if not 45°.

Input electrode 18A, ground electrode 19A, first output electrode 20A, and second output electrode 20B are all composed of silver, silver palladium or the like.

Second bridge circuit 14 is similarly structured to first bridge circuit 13, and has fifth detecting element 12E, sixth detecting element 12F, seventh detecting element 12G and eighth detecting element 12H, and is connected to input electrode 18B, ground electrode 19B, third output electrode 20C and fourth output electrode 20D.

These constituent members are corresponding, like fifth detecting element 12E of second bridge circuit 14 to first detecting element 12A of first bridge circuit 13. Similarly, sixth detecting element 12F corresponds to second detecting element 12B, seventh detecting element 12G to third detecting element 12C, eighth detecting element 12H to fourth detecting circuit 12D, input electrode 18B to input electrode 18A, ground electrode 19B to ground electrode 19A, third output electrode 20C to first output electrode 20A, and fourth output electrode 20D to second output electrode 20B.

Still further, input electrode 18A and input electrode 18B are electrically connected and ground electrode 19A and ground electrode 19B are also electrically connected. Thus, first bridge circuit 13 and second bridge circuit 14 are electrically connected in parallel.

Input electrodes 18A and 18B, ground electrodes 19A and 19B, first output electrode 20A, second output electrode 20B, third output electrode 20C and fourth output electrode 20D are all exposed for inputting or outputting signals from the outside.

Insulating layer 15A is deposited on the upper surface of first bridge circuit 13, and insulating layer 15B on the upper surface of second bridge circuit 14. The layers are composed of a material having an insulating characteristic, such as $SiO_2$, alumina epoxy resin or silicon resin. They electrically insulate first and second bridge circuits 13 and 14 from first and second application parts 16 and 17. Insulating layer 15A covers first detecting element 12A to fourth detecting element 12D and insulating layer 15B covers fifth detecting element 12E to eighth detecting element 12H.

If $SiO_2$ is used for insulating layers 15A and 15B, and if CoPt alloy is used for first and second application parts 16 and 17, intimacy of contact of the insulating layers with first and second application parts 16 and 17 is strengthened, thereby reliability including humidity resistance is improved and cost of the device is reduced.

First application part 16 is disposed on the upper surface of insulating layer 15A facing toward first bridge circuit 13, and second application part 17 is disposed on the upper surface of insulating layer 15B facing toward second bridge circuit 14. These parts are made of magnet such as CoPt ally, CoCrPt alloy or ferrite of which a magnetic field is aligned in one direction. First application part 16 entirely covers first bridge circuit 13, and second application part 17 entirely covers second bridge circuit 14. Directions of the magnetic fields produced by first application part 16 and second application part 17 are substantially 90° different as mentioned above. First and second application parts 16 and 17 generate magnetic field in a strength of 5 to 20 Oe.

Next, the reason why the strength of the magnetic field is set in 5 to 20 Oe is explained.

Figure 5:
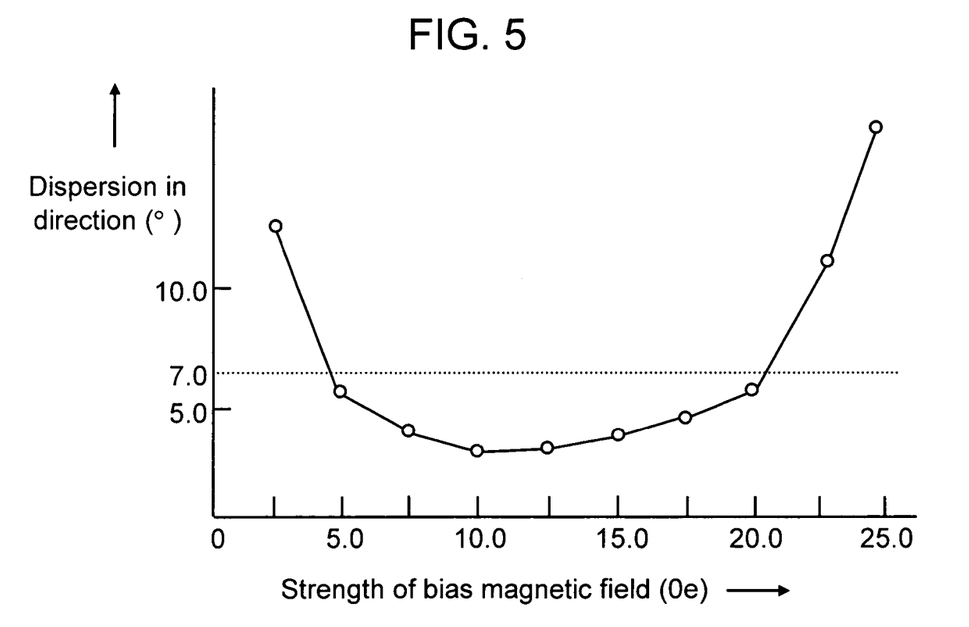
FIG. 5 is a graphical illustration showing a relation between a magnetic field strength of the first and second magnetic bias application parts and a variation of detected direction on the direction sensor in accordance with the first exemplary embodiment of the present invention.

FIG. 5 is a graph showing a relation between a magnet field strength generated by first and second application parts 16 and 17 and a dispersion of detected direction. In the graph, allowable dispersion in the detected direction is shown to be 7°, which is a maximum allowable dispersion in detecting 36 points of compass direction.

As is evidently shown in FIG. 5, the dispersion in the detected direction is reduced between the magnetic field strength in 5 to 20 Oe and where the direction is more precisely identified.

Setting in above range, since the magnetic field strength is set 20 Oe at most, a difference between a field strength of terrestrial magnetism and the magnetic field strength becomes small. Still further, since the magnetic field strength is set at 5 Oe at least, first and second bridge circuits 13 and 14 generate the outputs above a certain strength. Because of the above reasons, it is desirable that the magnetic field strength of first and second application parts 16 and 17 is set in a range of 5 to 20 Oe.

When a narrower dispersion is required in detecting a direction, the range of the magnetic field strength needs to be further limited. For example, when a 5° of directional dispersion is required, the magnetic field strength is set between 6.0 and 18.0 Oe, or more preferably between 7.5 and 15.0 Oe.

If CoPt alloy is employed for first and second application parts 16 and 17, the thickness of the application parts can be made smaller, to around 500 nm. In this case, the strength of the bias magnetic field is stabilized because of small dispersion of the thickness.

If ferrite is employed for first and second application parts 16 and 17, cost of application parts 16 and 17 can be reduced.

Next, a production method of the direction sensor in accordance with the first exemplary embodiment of the present invention will be described.

First, first detecting element 12A to eighth detecting element 12H, input electrodes 18A and 18B, ground electrodes 19A and 19B, and first output electrode 20A to fourth output electrode 20D are formed on the upper surface of substrate 11. To form them, a method such as a printing or a vapor deposition is used.

At this time, first bridge circuit 13 is formed with first detecting element 12A to fourth detecting element 12D, as well as forming input electrode 18A, ground electrode 19A, first output electrode 20A and second output electrode 20B respectively at predetermined positions. Similarly, second bridge circuit 14 is formed with fifth detecting element 12E to eighth detecting element 12H, as well as forming input electrode 18B, ground electrode 19B, third output electrode 20C and fourth output electrode 20D at respective positions.

Next, insulating layer 15A is formed on the upper surface of first bridge circuit 13 as well as forming insulating layer 15B on the upper surface of second bridge circuit 14. As previously mentioned, insulating layer 15A is formed covering first detecting element 12A to fourth detecting element 12D, and insulating layer 15B covering fifth detecting element 12E to eighth detecting element 12H.

Then, first magnetic bias application part 16 is formed on the upper part of insulating layer 15A as the part facing toward first bridge circuit 13, by a printing or an etching method, as well as forming second magnetic bias application part 17 on the upper part of insulating layer 15B, facing toward second bridge circuit 14. Then, magnetic field-generating coils are approximated to first and second application parts 16 and 17 for establishing the magnetic fields directed in certain directions.

In this process, longitudinal directions of first detecting element 12A to eighth detecting element 12H are arranged so as to cross the magnetic fields produced by first and second application parts 16 and 17 at an angle of 45°, and the magnetic field directions produced by first and second application parts 16 and 17 are to be directed about 90° different from each other, as shown in FIG. 3.

It is desirable that first and second application parts 16 and 17 are formed by a liftoff method; thereby insulating layer 15A, insulating layer 15B, first and second bridge circuits 13 and 14 are prevents from being damaged.

Namely, a resist is applied at a place where first and second application parts 16 and 17 are not to be formed, next magnetic materials forming first and second application parts 16 and 17 are applied on an entire surface of insulating layers 15A, 15B, and then the resist is removed, forming first and second application parts 16 and 17 at their predetermined positions. In this process, unnecessary magnetic material is removed when the resist is removed. It is not necessary to remove the unwanted magnetic material selectively as is required by the etching method. Therefore, bridge circuits 13 and 14 and insulating layers 15A and 15B are prevented from being attached or penetrated by etching liquid.

Especially when CoPt alloy is etched for forming first and second application parts 16 and 17, a strong acid of etching liquid is used. The etching liquid damages insulating layers 15A and 15B or first and second bridge circuits 13 and 14, deteriorating humidity resistance and sacrificing reliability. By using the liftoff method, these problems are avoided and a high reliability direction sensor is provided.

In this exemplary embodiment, the magnetic fields are aligned after first and second application parts 16 and 17 are formed. By doing so, the magnetic fields of first and second application parts 16 and 17 are simultaneously or successively aligned so that productivity is improved. In the placing process, a magnet of which magnetic field has already aligned can be disposed on the upper surface of insulating layers 15A and 15B.

Lastly, cover layers 21A is formed on the upper surface of first application part 16, as well as cover layer 21B being form on the upper surface of second application part 17, by a molding method, for instance.

Next, the working principle of the direction sensor in accordance with the first exemplary embodiment of the present invention will be explained.

First, a prescribed voltage is applied between input electrode 18A and ground electrode 19A in first bridge circuit 13. Then, the magnetic fields generated by first magnetic bias application part 16 and the terrestrial magnetism change the resistance values of first detecting element 12A to fourth detecting element 12D. At this time, first output electrode 20A and second output electrode 20B output voltages corresponding to the change of the resistance values, and differential voltage between the two outputs is detected. This voltage changes depending on an angle by which the terrestrial magnetism crosses first bridge circuit 13. The voltage changes substantially sinusoidally dependent on the angle by which the terrestrial magnetism and first bridge circuit 13 cross.

In second bridge circuit 14, a differential output voltage changing almost sinusoidally with an crossing angle of the terrestrial magnetism and second bridge circuit 14 is similarly detected between third output electrode 20C and fourth output electrode 20D.

In this instance, the magnetic field direction of first application part 16 and that of second application part 17 are different by 90°, namely a phase of one differential output voltage is shifted by 90° from that of another differential another voltage. Assuming an angle of direction as $\theta$, one output voltage is represented by $A \sin \theta$ and another is represented by $A' \cos \theta$. Standardized by amplitude $A$ and $A'$, tan θ, an output ratio between the two, is given out, easily identifying the direction θ. If a variation of the magnetic field strength of both of the magnetic application parts is controlled so as to make both amplitudes identical, the standardization process is unnecessary.

At this time, the magnetic field directions being generated by first and second application parts 16 and 17 are controlled so that dispersion of measured directional angle θ is restricted within a prescribed range, for instance 7°. In this exemplary embodiment, an angle between magnetic field directions 31 and 32 produced by first and second application parts 16 and 17 is made to be around 90°. However, the angle does not need to be 90°. As long as the magnetic field directions of first and second application parts 16 and 17 are different, the outputs from first and second bridge circuits 13 and 14 are out of phase with respect to each other. Because the output from first bridge circuit 13 changes sinusoidally, a same output value is measured in two directional angles. However, one direction is finally identified with a sign of difference between the output from first bridge circuit 13 and that of second bridge circuit 14. Thus, all directions from 0° to 360° are identified. At this time, the directions of the magnetic fields of first and second bridge circuits 13 and 14 have to be differentiated so that the phase of the outputs may not overlap.

In this exemplary embodiment, insulating layers 15A and 15B are respectively separated individual layers, and cover layers 21A and 21B are also separated individual layers. Nevertheless, the layers can be integrated as illustrated in FIG. 6.

Figure 6:
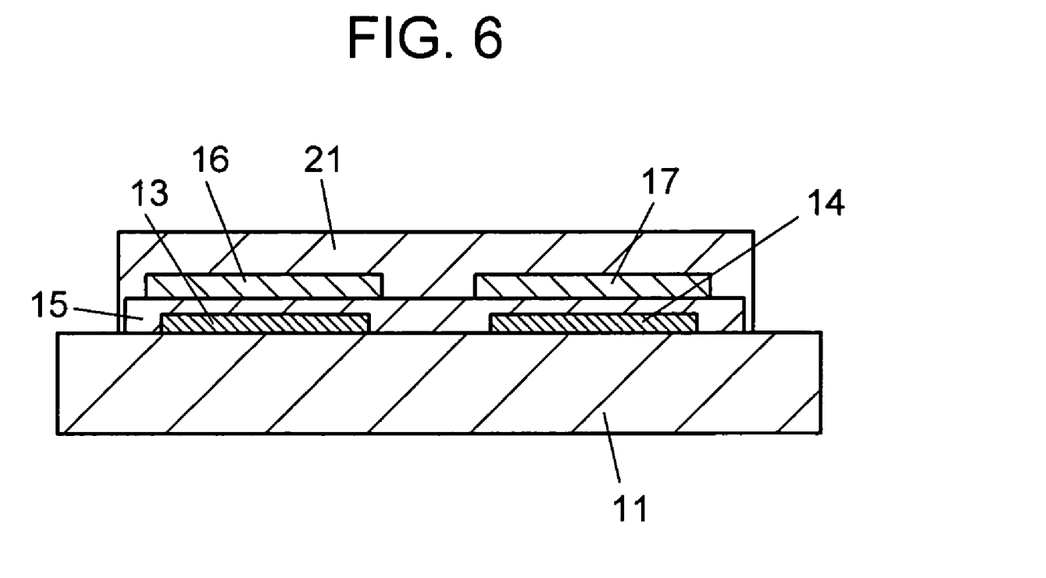
FIG. 6 is a sectional view of another direction sensor in accordance with the first exemplary embodiment of the present invention.

FIG. 6 is a sectional view of another direction sensor in accordance with the first exemplary embodiment of the present invention. Insulating layer 15 overlays first bridge circuit 13 and second bridge circuit 14 altogether, and cover layer 21 covers first application part 16 and second application part 17 altogether.

Even with this constitution, a similar effect is obtained as in the direction sensor shown in FIG. 1.

Second Exemplary Embodiment

Figure 7:
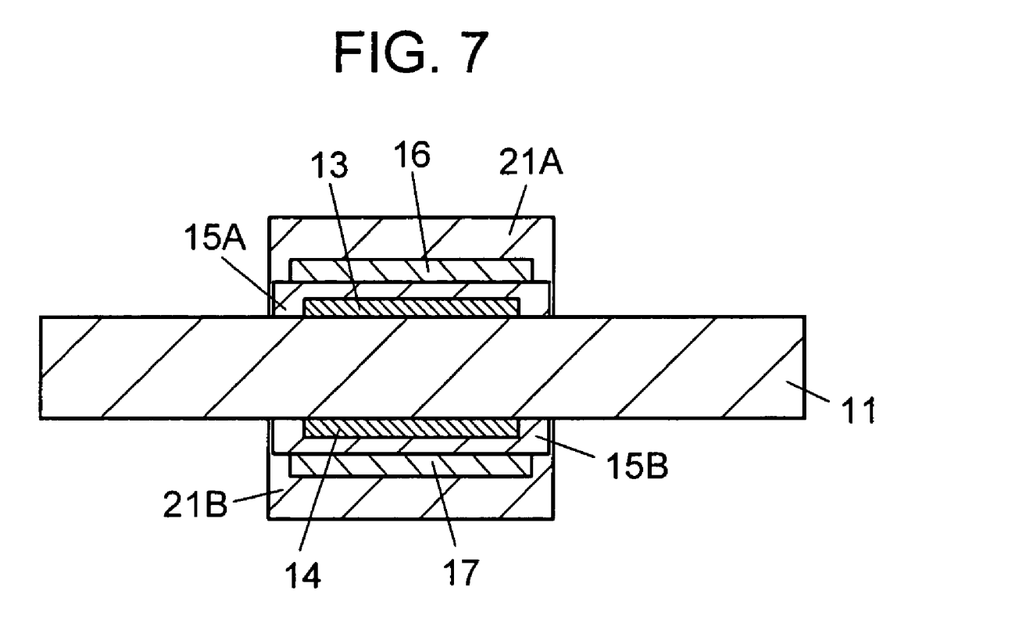
FIG. 7 is a sectional view of a direction sensor in accordance with a second exemplary embodiment of the present invention.

A second exemplary embodiment of the present invention will be explained using FIG. 7. FIG. 7 is a sectional view of a direction sensor in accordance with the second exemplary embodiment of the present invention.

In the first exemplary embodiment, components including first and second bridge circuits are formed on one side of the substrate. Whereas, in the second exemplary embodiment, a first bridge circuit is formed on an upper surface of a substrate while a second bridge is formed on a under surface of the substrate, otherwise the structure of this embodiment is identical to that of the first exemplary embodiment.

In the following, the structure of the second exemplary embodiment is explained.

First bridge circuit 13 is formed on an upper surface of substrate 11. First insulating layer 15A is deposited on an upper surface of first bridge circuit 13. First magnetic bias application part 16 is disposed on an upper surface of first insulating layer 15A, facing toward first bridge circuit 13. First cover layer 21A is formed an upper surface of the first magnetic bias application part 16.

Second bridge circuit 14 is formed on an under surface of substrate 11, and second insulating layer 15B is deposited on an under surface of second insulating layer 15B. Second magnetic bias application part 17 is disposed on an under surface of second insulating layer 15B, facing toward second bridge circuit 14. On an under surface of the second magnetic bias application part 17, second cover layer 21B is formed.

As described, in the direction sensor in accordance with the second exemplary embodiment of the present invention, each of first and second bridge circuits 13 and 14 is formed on a different surface of substrate 11. Because of this structure, the dimensions of a main surface are smaller than when the first and second bridge circuits is formed on one surface. Hence, the direction sensor can be produced smaller. Furthermore, since first and second application parts 16 and 17 are formed on different surfaces, a distance between first and second application parts 16 and 17 is made larger, making a magnetic field influence of first application part 16 over second bridge circuit 14 small. Likewise, a magnetic field influence of second application part 17 over first bridge circuit 13 becomes small.

Third Exemplary Embodiment

Figure 8:
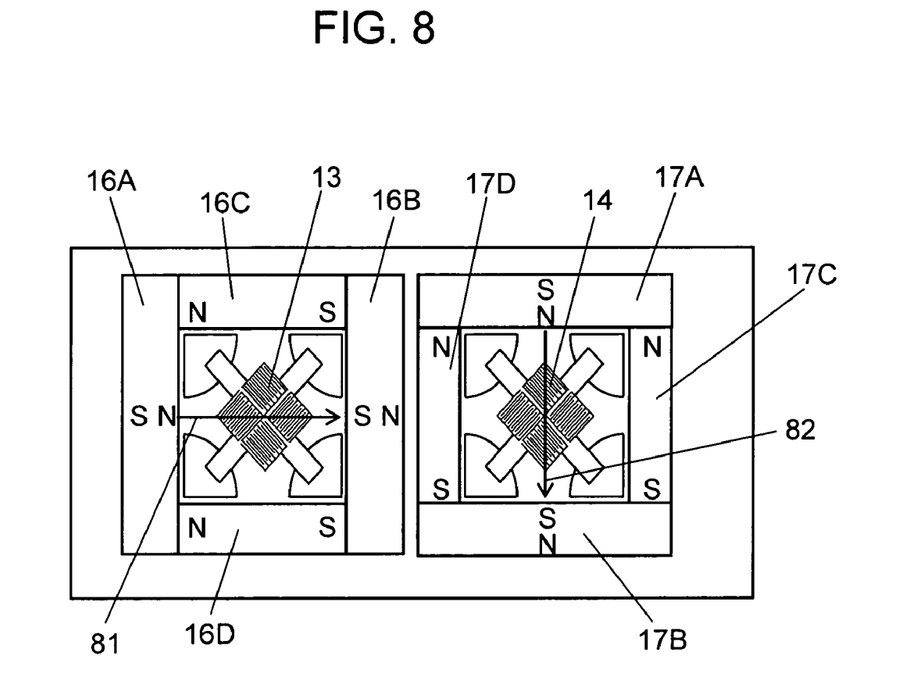
FIG. 8 is a plan view of an upper surface of first and second bridge circuits, main parts of a direction sensor in accordance with a third exemplary embodiment of the present invention.

A third exemplary embodiment of the present invention will be explained using FIG. 8. FIG. 8 is a plan view of an upper surface of first and second bridge circuits, main parts of a direction sensor in accordance with the third exemplary embodiment of the present invention.

In the direction sensor of the third exemplary embodiment, magnetic field bias application parts are additionally formed around first and second bridge circuits 13 and 14 as seen in the plan view.

As FIG. 8 shows, magnetic bias application parts 16A, 16B, 16C and 16D are placed around first bridge circuits 13, constituting a surrounding magnetic bias application part. Similarly, magnetic bias application parts (hereinafter called an application part) 17A, 17B, 17C and 17D are placed around second bridge circuit 14.

In this structure, one side of application part 16A facing first bridge circuit 13 is polarized to N. One side of application part 16B facing toward application part 16A through first bridge circuit 13 is polarized to S. Application part 16C, disposed between application part 16A and application part 16B along bridge circuit 13 is polarized to N at a side facing application part 16A and S at a side facing application part 16B. Application part 16D facing toward application part 16C through first bridge circuit 13 and disposed between application part 16A and application part 16B is polarized to N at a side facing application part 16A and S at a side facing application part 16B.

Application parts 17A to 17D are disposed around second bridged circuit 14; their magnetic fields are rotated 90° clockwise relative to those of application parts 16A to 16D.

The direction sensor in the third exemplary embodiment is constituted by adding application parts 16A to 16D and 17A to 17D to the direction sensor of the first exemplary embodiment. In other words, first application part 16 and second application part 17 are respectively positioned upward of first bridge circuit 13 and second bridge circuit 14, though it is not illustrated in the drawing. In this structure, the magnetic field direction of first application part 16 is to N at its left side and S at its right side, as shown by arrow mark 81 in FIG. 8. The magnetic field direction of second application part 17 is to N at the upside and S at the down side, as shown by arrow mark 82.

With this structure, it is hard for the magnetic field to leak out of a space surrounded by application parts 16A to 16D. Because of its high efficiency of magnetic field application to first bridge circuit 13, the application parts 16 and 16A to 16D can function even when the magnetic field strength of the magnets of application parts 16 and 16A to 16D is weak.

By constituting so, a probability that the magnetic field applied to first bridge circuit 13 may affect second bridge circuit 14 remains low. Application parts 17A to 17D work similarly.

Above, the first to third exemplary embodiments of the present invention are explained. In addition, because a holder or a coil is not required for the structures, the direction sensors can be manufactured small. Still further, because the permanent magnets are used for generating the bias magnetic field instead of energization of a coil, the direction sensors do not require electric power of producing the magnetic fields, so that energy is saved. This type of detection sensor can be installed on a mobile device or the like.

Figure 9:
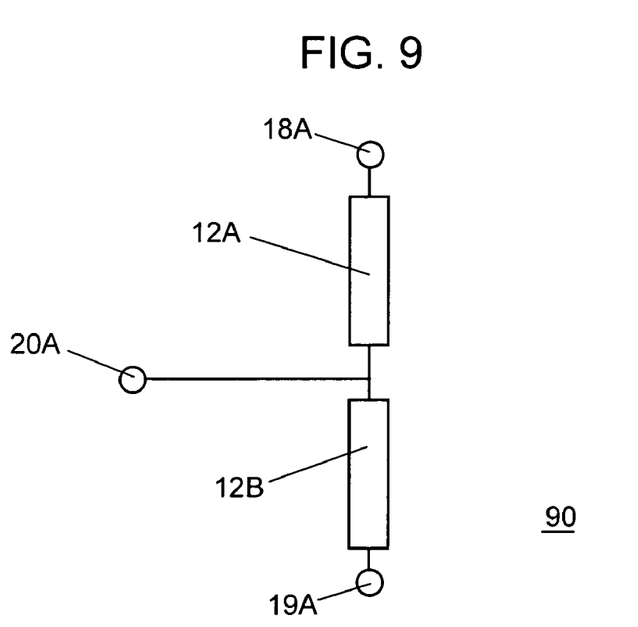
FIG. 9 is a circuit diagram of a varied type of the first detecting circuit of the direction sensors in accordance with the first to the third exemplary embodiments of the present invention.

In all the above embodiments, the first detecting circuit and the second detecting circuit respectively employ a bridge circuit composed of four detecting elements for detecting a differential voltage. On the other hand, the first detecting circuit and the second detecting circuit can be composed of a half bridge circuit using two detecting elements. The half bridge circuit will be explained as follows using FIG. 9. FIG. 9 is a circuit diagram of a varied type of the first detecting circuit of the direction sensor according to the present invention.

First detecting circuit 90 is composed of first detecting element 12A and second detecting element 12B. In first detecting circuit 90, a prescribed voltage is applied between first input electrode 18A and ground electrode 19A then a differential voltage between first output electrode 20A and ground electrode 19A is detected. Because the circuit is half of the bridge circuit, it is called a 'half bridge circuit.'

A positional relationship between first detecting element 12A and second detecting element 12B and a positional relationship between the detecting elements and the magnetic field direction of the first magnetic bias application part facing against first detecting circuit 90 are identical to those in the first exemplary embodiment.

The second detecting circuit can be similarly constituted.

The circuitry of the half bridge circuit of this kind requires half the number of the detecting elements required for the bridge circuit. Hence, a required dimension is small and the circuit is simple, and therefore advantageous for miniaturization.

INDUSTRIAL APPLICABILITY

As mentioned above, the direction sensor according to the present invention has the following constituents:
a substrate,
a first detecting circuit having at least two detecting elements formed on a main surface of the substrate; and a second detecting circuit having an identical structure,
a first magnetic bias application part disposed facing toward the first detecting circuit,
a second magnetic bias application part disposed facing toward the second detecting circuit, and generating a magnetic field in a direction different from that of the first magnetic bias application part.

This structure does not require a holder or a coil, thereby a feasible miniaturized direction sensor is obtained.

The invention claimed is:
1. A direction sensor comprising:
a substrate;
a first detecting circuit formed on the substrate and including at least two detecting elements;
a second detecting circuit formed on the substrate and including at least two detecting elements;
a first magnetic bias application part disposed facing toward the first detecting circuit, the first magnetic bias application part operable to apply a magnetic bias to the first detecting circuit by producing a magnetic field; and
a second magnetic bias application part disposed facing toward the second detecting circuit, the second magnetic bias application part operable to apply a magnetic bias to the second detecting circuit by producing a magnetic field having a direction that is different from a direction of the magnetic field produced by the first magnetic bias application part,
wherein the first detecting circuit includes:
a first detecting element having a longitudinal pattern direction;
a second detecting element having a longitudinal pattern direction that is different from the longitudinal pattern direction of the first detecting element, the second detecting element being electrically connected to the first detecting element in series;
a third detecting element having a longitudinal pattern direction that is in parallel with the longitudinal pattern direction of the second detecting element; and
a fourth detecting element having a longitudinal pattern direction that is in parallel with the longitudinal pattern direction of the first detecting element, the fourth detecting element being electrically connected to the third detecting element in series,
wherein the first detecting element and the second detecting element in series are electrically connected in parallel to the third detecting element and the fourth detecting element series,
wherein the second detecting circuit includes:
a fifth detecting element having a longitudinal pattern direction;
a sixth detecting element having a longitudinal pattern direction that is different from the longitudinal pattern direction of the fifth detecting element, the sixth detecting element being electrically connected to the fifth detecting element in series;
a seventh detecting element having a longitudinal pattern direction that is in parallel with the longitudinal pattern direction of the sixth detecting element; and
an eighth detecting element having a longitudinal pattern direction that is in parallel with the longitudinal pattern direction of the fifth detecting element, the eighth detecting element being electrically connected to the seventh detecting element in series, and
wherein the fifth detecting element and the sixth detecting element are electrically connected in parallel, and the seventh detecting element and the eighth detecting element are electrically connected in parallel.

2. The direction sensor according to claim 1,
wherein a direction of the magnetic field produced by the first magnetic bias application part and a direction of the magnetic field produced by the second magnetic bias application part are 90° apart,
wherein the longitudinal pattern direction of the first detecting element and the longitudinal pattern direction of the second detecting element are 90° apart, and
wherein the longitudinal pattern direction of the fifth detecting element and the longitudinal pattern direction of the seventh detecting element are 90° apart.

3. The direction sensor according to claim 2,
wherein the direction of the magnetic field produced by the first magnetic bias application part and the longitudinal pattern direction of the first detecting element are 45° apart, and
wherein the direction of the magnetic field produced by the second magnetic bias application part and the longitudinal pattern direction of the fifth detecting element are 45° apart.

4. A direction sensor comprising:
a substrate;
a first detecting circuit formed on the substrate and including at least two detecting elements;
a second detecting circuit formed on the substrate and including at least two detecting elements;
a first magnetic bias application part disposed facing toward the first detecting circuit, the first magnetic bias application part operable to apply a magnetic bias to the first detecting circuit by producing a magnetic field; and
a second magnetic bias application part disposed facing toward the second detecting circuit, the second magnetic bias application part operable to apply a magnetic bias to the second detecting circuit by producing a magnetic field having a direction that is different from a direction of the magnetic field produced by the first magnetic bias application part,
wherein the first detecting circuit includes:
a first detecting element having a longitudinal pattern direction; and
a second detecting element having a longitudinal pattern direction that is different from the longitudinal pattern direction of the first detecting element, the second detecting element being electrically connected to the first detecting element in series,
wherein the second detecting circuit includes:
a third detecting element having a longitudinal pattern direction; and
a fourth detecting element having a longitudinal pattern direction that is different from the longitudinal pattern direction of the third detecting element, the fourth detecting element being electrically connected to the third detecting element in series.

5. A direction sensor comprising:
a substrate;
a first detecting circuit formed on the substrate and including at least two detecting elements;
a second detecting circuit formed on the substrate and including at least two detecting elements;
a first magnetic bias application part disposed facing toward the first detecting circuit, the first magnetic bias application part operable to apply a magnetic bias to the first detecting circuit by producing a magnetic field; and
a second magnetic bias application part disposed facing toward the second detecting circuit, the second magnetic bias application part operable to apply a magnetic bias to the second detecting circuit by producing a magnetic field having a direction that is different from a direction of the magnetic field produced by the first magnetic bias application part,
wherein the first detecting circuit is formed on a first surface of the substrate and the second detecting circuit is formed on a second surface of the substrate opposite to the first surface.

* * * * *